United States Patent
Souetinov et al.

(10) Patent No.: US 6,308,058 B1
(45) Date of Patent: *Oct. 23, 2001

(54) IMAGE REJECT MIXER

(75) Inventors: Viatcheslav I Souetinov, Swindon (GB); Tak K Chan, Kowloon (HK)

(73) Assignee: Mitel Semiconductor Limited (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,906

(22) Filed: Jan. 7, 1998

(30) Foreign Application Priority Data

Jan. 11, 1997 (GB) .................................. 9700485

(51) Int. Cl.$^7$ ........................................... H04B 1/26
(52) U.S. Cl. ........................... 455/326; 455/323; 327/359
(58) Field of Search ................... 455/333, 324, 455/326, 332, 323, 314, 302; 327/356, 357, 359

(56) References Cited

U.S. PATENT DOCUMENTS

| | | | |
|---|---|---|---|
| 4,675,911 | * 6/1987 | Sokolov et al. | 455/325 |
| 4,994,755 | * 2/1991 | Titus et al. | 330/54 |
| 5,303,417 | * 4/1994 | Laws | 455/314 |
| 5,361,408 | * 11/1994 | Watanabe et al. | 455/324 |
| 5,448,772 | * 9/1995 | Grandfield | 455/333 |
| 5,625,307 | * 4/1997 | Scheinberg | 327/113 |
| 5,630,228 | * 5/1997 | Mittel | 455/326 |
| 5,847,623 | * 12/1998 | Hadjichristos | 332/105 |
| 6,029,059 | * 2/2000 | Bojer | 455/326 |

FOREIGN PATENT DOCUMENTS 2 239 143 A    6/1991    (GB) .

* cited by examiner

*Primary Examiner*—Thanh Cong Le
(74) *Attorney, Agent, or Firm*—Kirschstein, et al.

(57) ABSTRACT

Circuit 200 comprises an input amplifier stage 290, phase-splitters 292, 293 and mixer cores 294, 295. An input signal is applied to terminal 220, a local oscillator signal applied to terminals 230, 231 and a 90° shifted local oscillator signal is applied to terminals 232, 233. The In-phase differential signal is output at terminals 240, 241 and the quadrature signal is output at terminals 240, 233. Phase-splitters 292, 293 comprise base-coupled transistors 202, 203, 205, 206 which are biased by a potential applied to terminal 262. As these phase-splitters are driven by input amplifier stage 290, which acts as a current source, the arrangement has very good noise properties. Degeneration inductor 280 reduces the noise figure of the circuit further because it is a noiseless component. Phase-splitters 292, 293 and mixer cores 294, 295 are preferably cross-coupled to allow cancellation in phase-splitters 292, 293 of the second harmonic of the local oscillator signal generated at the inputs to mixer cores 294, 295.

13 Claims, 2 Drawing Sheets

IMAGE REJECT MIXER

BACKGROUND OF THE INVENTION

The present invention relates to image reject mixer circuits and in particular to image reject mixer circuits having a single ended input and two differential outputs. Radio frequency image reject mixers are very popular blocks of modern radio systems and are often used in preference to superheterodyne receivers, especially where frequency agility is required. The parameters of an image reject mixer determine the main characteristics of the system into which they are incorporated.

Prior art image reject mixers are generally based on the Gilbert cell or the micromixer circuit configuration. In the case of the Gilbert cell, an image reject mixer is compiled simply by connecting two Gilbert cell circuits in parallel. The input signal is split into two branches where they are mixed with an unshifted local oscillator signal and a 90° shifted local oscillator signal respectively.

A section of an image reject mixer circuit based on the micromixer configuration is shown in FIG. 1.

In use, an input signal is applied to terminal 120, a local oscillator signal is applied to terminals 130, 131 and a 90° phase shifted local oscillator signal is applied to terminals 132, 133. A reference potential is applied to terminal 125 to bias transistors 103 and 104. By virtue of resistors 150, 151, transistor 105 and biased transistor 103, a signal input at terminal 120 will give rise to complementary output current signals at the collector electrodes of transistors 103 and 101. Mixer core 160, formed by transistors 106–109, mixes the current signals from the collector electrodes of transistors 101 and 103 with the local oscillator signal applied to terminals 130, 131 and outputs a current signal at terminals 140, 141. Transistors 102 and 104 produce at their collector electrodes substantially the same current signal as is produced by corresponding transistor 101, 103 because these corresponding transistors are driven by the same input signal. Mixer core 170 mixes the current signal from the collector electrodes of transistors 102, 104 with a 90° phase shifted local oscillator signal applied to terminals 132, 133 and outputs a current signal at terminals 142, 143. Because an unphased oscillator signal is applied to terminals 130, 131 and a 90° phase shifted signal is applied to terminals 132, 133, output terminals 140, 141 will show an In-phase differential output and output terminals 142, 143 will show a Quadrature differential output.

As will be appreciated, the mixer circuit shown in FIG. 1 is incomplete. The full mixer circuit implementation would also have means for phase-shifting the output of mixer core 170 by 90° and summing the resultant signal with the output from mixer core 160. This would result in either the image band signal or the signal band signal as the complete mixer circuit output, depending on the sign of the 90° phase-shift imposed on the signal output from mixer core 170.

Whilst the image reject mixer circuit section of FIG. 1 has a wide dynamic range and very linear operation, the presence of so many resistors gives the mixer circuit very poor noise properties.

Image reject mixers constructed from Gilbert cell circuits have poor noise properties due to resistors in the main current paths, current sources experiencing high frequency, large voltage swings and poor transistor arrangements. It is difficult also to design an image reject mixer using Gilbert cell circuits so that it has a particular input impedance. This can be a drawback when impedance matching with a preamp stage is necessary. There exists a need for an image reject mixer circuit with improved noise properties.

SUMMARY OF THE INVENTION

In accordance with the present invention, there is provided an image reject mixer circuit arrangement comprising an input amplifier connected to first and second phase-splitters, the phase-splitters each having two substantially complementary outputs, a first mixer core arranged to mix two of said phase-splitter outputs with a local oscillator signal and a second mixer core arranged to mix the other two of said phase splitter outputs with a phase shifted local oscillator signal.

BRIEF DESCRIPTION OF THE DRAWINGS

Embodiments of the present invention will now be described, by way of example only, with reference to the accompanying drawings, of which.

DETAILED DESCRIPTION OF THE PREFERRED EMBODIMENTS

Figure 1:
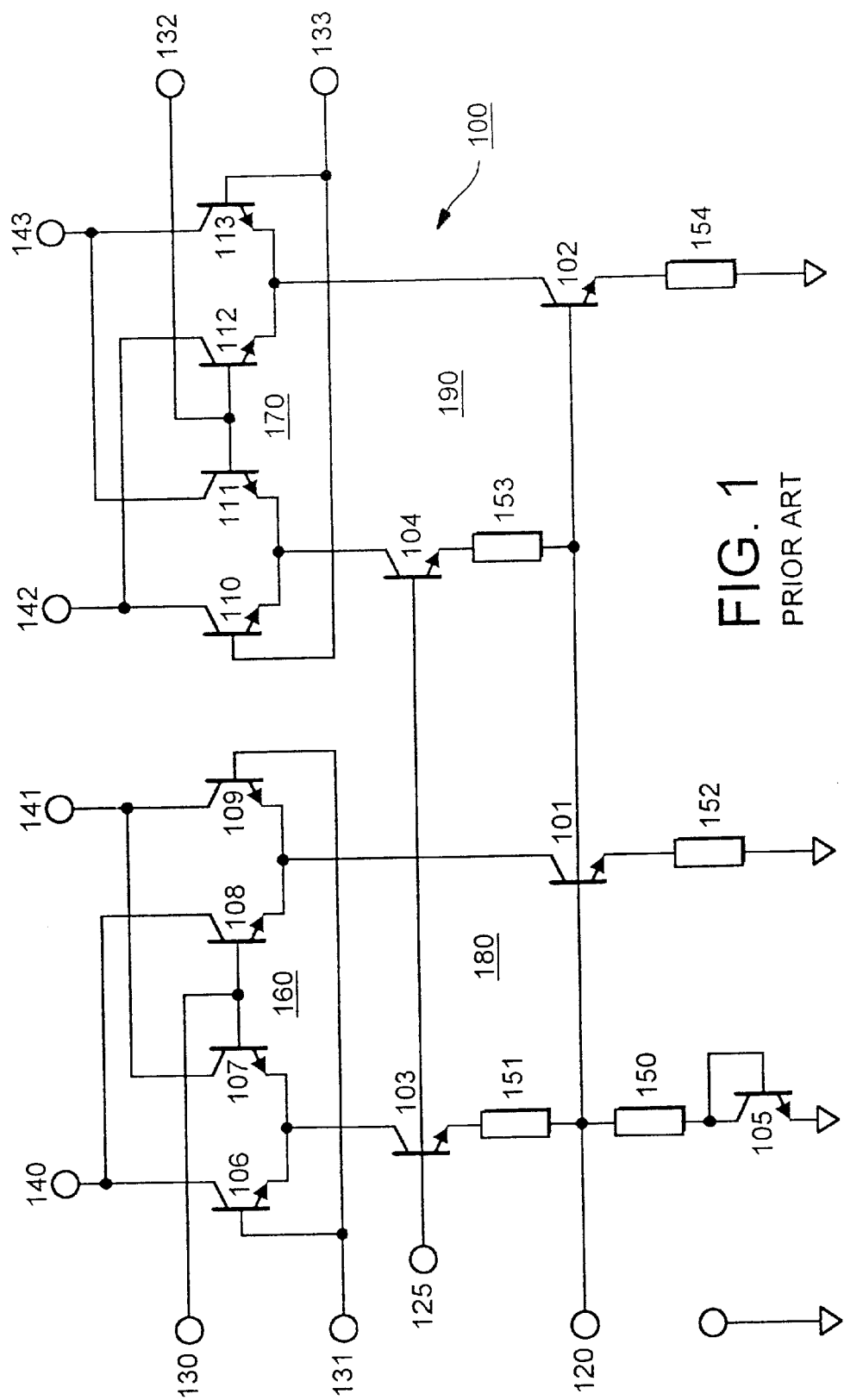
FIG. 1 shows a section of a prior art image reject mixer circuit.
Figure 2:
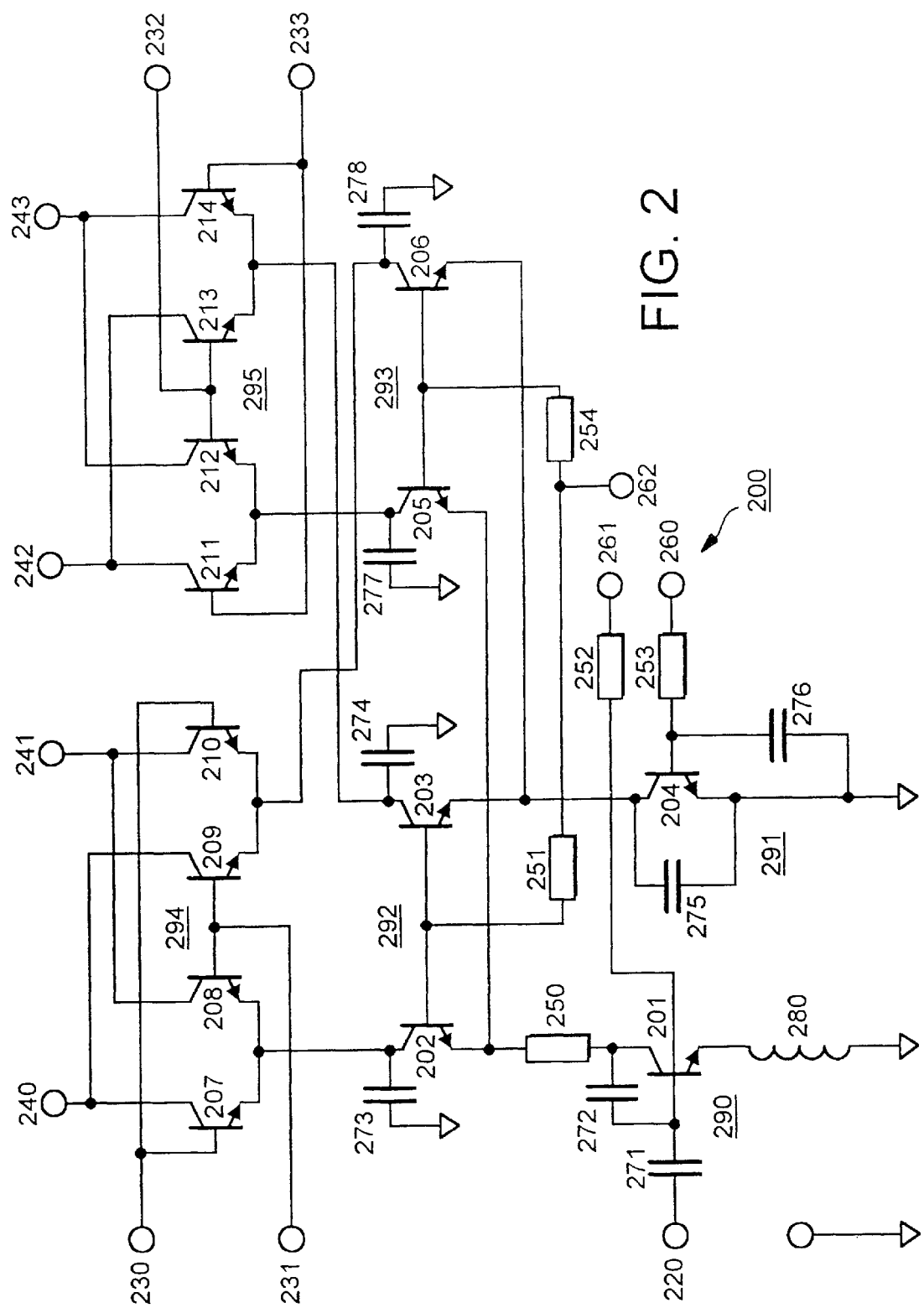
FIG. 2 shows an image reject mixer circuit section in accordance with the present invention.

Referring to FIG. 2, an image reject mixer circuit section 200 is shown comprising input stage 290, phase-splitter stages 292, 293 and mixer cores 294, 295. Mixer cores 294, 295 are substantially the same as those used in prior art mixer circuits. The noise properties of image reject mixer circuit section 200 are better than those of prior art mixers because of improved amplification and phase splitting stages 290, 292, 293.

Terminal 220 forms the mixer circuit input terminal, terminals 240 and 241 form the In-phase output terminals and terminals 242, 243 form the Quadrature output terminals. In use, a local oscillator signal is applied to terminals 230, 231 and a 90° phase shifted oscillator signal is applied to terminals 232, 233. Potentials are applied to terminals 260 and 261 to form bias potentials with resistors 253 and 252 respectively whilst the potential applied to terminal 262 forms two bias currents with resistors 251 and 254. Resistors 251 and 254 are preferably high value resistors so as to deliver small but substantially constant currents to phase-splitters 292, 293.

Input stage 290 is a transconductance amplifier. It receives a voltage signal applied to input terminal 220 and supplies output current to both phase splitters 292, 293. Transistor 201, of input stage 290, is connected to each of transistors 202 and 205, of phase splitter stages 292, 293 respectively, in a cascode configuration. Transistor 202 is base-coupled to transistor 203 and, likewise, transistor 205 is base-coupled to transistor 206. Degeneration inductor 280 connects the emitter electrode of transistor 201 to ground potential. Due to the complex nature of the common emitter current gain β of the transistor 201, inductor 280 effects series negative feedback in the base-emitter circuit of transistor 201.

Transistors 202 and 203 have complementary collector currents. Variations in the collector current of transistor 201 directly cause variations in the distribution of the current flowing in resistor 251 between the base electrodes, and hence the collector electrodes, of transistors 202 and 203. Transistors 202 and 203 introduce a negligible level of noise into mixer circuit 200 because they are driven by the output current of amplifier stage 290 rather than being voltage driven. Transistors 205 and 206 are configured in the same way as transistors 202, 203.

Transistors 202 and 205 are current driven by transistor 201, resistor 252 and a potential applied to terminal 261. Transistors 203 and 206 are similarly driven by transistor 204, resistor 253 and a potential applied to terminal 260. The balancing of the output signals from each phase-splitter 202, 203 and 205, 206 can thus be controlled by either changing the values of resistors 252, 253 or by changing the potentials applied to terminals 260, 261. Capacitors 271, 275, 276 are simply ac grounding and dc blocking capacitors.

Cascode circuits per se are well known for their good noise properties. From FIG. 2 it can be seen that these good noise properties are achieved because transistors 202 and 205 prevent the collector of transistor 201 from swinging and thereby substantially eliminate the Miller effect.

Inductor 280 is a noiseless component which provides substantially frequency independent degeneration over a particular frequency range. This range is dependent on the value of inductor 280 and the base-emitter resistance of transistor 201 at the desired frequency. The value of inductor 280 also affects the gain of amplifier stage 290 and its linearity. Although a resistor could be used in place of inductor 280, amplifier stage 290 has much more linear characteristics and better noise properties when inductor 280 is used.

Inductor 280 can be implemented, in whole or in part, with the parasitic inductance of IC packaging, bonding wires and/or connecting pins.

Transistors that are used in low noise applications are generally fabricated with large emitter areas. These transistors have a lower base-emitter resistance than a smaller area transistor and hence produce less noise.

Transistors 201–203, 205–206 are preferably implemented as large emitter area transistors and more preferably with transistor 201 having a larger area than transistors 202–203 and 205–206. The sizing of transistor 201 is particularly important because it determines a number of properties of the amplifier stage 290. A larger area transistor will have better noise properties because the input impedance of the transistor will be lower. However, a larger area transistor will also have higher parasitic capacitances, and hence leakage, and a lower current gain β caused by a lower current density.

The size of the current flowing in transistor 201 affects its impedance and also therefore the properties of amplifier stage 290. Operating transistor 201 with a low current will give it good noise properties but will also cause β, and hence overall gain, to be lower than it would be for a higher operating current.

A trade-off needs to be made between noise figure and gain when choosing what transistor area and what driving current should be incorporated into a particular image reject mixer circuit design.

At high frequencies, the behaviour of transistors 202, 203, 205 and 206 will change because of the parasitic capacitances present across both the base-emitter and base-collector junctions of these transistors. Leakage will occur between the emitter and the base electrodes of transistors 202 and 205 causing unbalancing of the outputs of each phase splitter 292, 293.

This can be compensated for by forming transistors 202 and 205 with larger emitter areas than those of transistors 203, 206. These larger area transistors will have a lower current density and hence a lower β. This will cause extra current to flow in the base of transistors 202, 205 to compensate for current lost in the parasitic capacitances.

The emitter areas of transistors 202, 203, 205, 206 required to balance the output signals will depend on the frequency at which mixer circuit section 200 is to be operated, because β is frequency dependent, and on the currents driving these transistors. Mixer core 294 receives a substantially sinusoidal local oscillator signal as a differential voltage signal on terminals 230, 231. When the voltage on terminal 230 is positive, the voltage on terminal 231 will be negative causing transistors 207 and 210 to be switched on and transistors 208 and 209 to be switched off. The collector current of transistor 202 will therefore be routed to output terminal 240 whilst the collector current of transistor 206 will be routed to output terminal 241. The collector currents of transistors 202, 206 will obviously be routed to the opposite terminal 240, 241 when terminal 231 receives a higher voltage than terminal 230.

Mixer core 295 operates in substantially the same way, routing the collector currents of transistors 203, 205 alternately to output terminals 242 and 243. Transistors 211–214 are switched, in use, under control of a 90° shifted local oscillator received on terminals 232, 233.

Capacitors 273, 278 serve as filters of the second harmonic of the local oscillator signal, applied to terminals 230, 231, that would normally be generated at the inputs of mixer core 294. This harmonic is generated because of the difference in the switching-on and switching-off delays of transistors 207–210 in mixer core 294. This harmonic would normally be mixed, as well as the input current signals from the collector electrodes of transistors 202, 206, by mixer core 294 and produce a parasitic signal at the local oscillator frequency at output terminals 240, 241. Capacitors 274, 277 similarly serve as filters of the harmonic signal generated by transistors 211–214 in mixer core 295. The values of capacitors 273–274, 277–278 have to be chosen as a trade-off between the efficiency of filtering and the efficiency of the conversion of the signals input to mixer cores 294, 295.

Additionally, a large proportion of the second harmonic is cancelled at the base electrodes of transistors 202–203, 205–206 by virtue of the cross coupling of phase-splitters 292, 293 and mixer cores 294, 295 because the second harmonics produced at the inputs to mixer core 295 are 180° out of phase to those produced at mixer core 294.

However, it will be obvious to the skilled man that this cross-coupling is not an essential part of the invention. The second harmonic of the local oscillator would be cancelled, though not as much, by capacitors 273, 274, 277, 278 even if the collector electrode of transistor 203 was connected to mixer core 294 and the collector electrode of transistor 206 was connected to mixer core 295.

Resistor 250 and capacitor 272 are preferably incorporated into an image reject mixer circuit design to improve the linearity of the mixer and to allow its input impedance to be tuned.

Resistor 250 is connected between transistors 201 and 202 to create a potential at the collector electrode of transistor 201 and 202 from the current flowing there. Resistor 250 will be of low value, say 20–30 Ω, so not introducing much noise into the circuit. Inductor 280 causes the voltage at the emitter electrode of transistor 201 to lead the voltage at the base electrode by 90°. Negative feedback is thus achievable by connecting capacitor 272 across the base and collector electrodes of transistor 201. This feedback will help to minimise the noise created by transistor 201 and improve the overall noise figure of mixer circuit section 200. Mixer circuit section 200 will also have improved linearity characteristics.

Capacitor 272 and resistor 250 will also have an effect on the input impedance of transistor 201, and hence mixer circuit section 200, thereby allowing the impedance to be tuned in the design of the mixer circuit. It is even possible to make the input impedance purely real.

Although the embodiments have been described solely with regard to npn bipolar resistors, the invention is not restricted to such and could equally be effected with pnp bipolar transistors or with field effect transistors. The collector and emitter electrodes referred to will be interchangeable with emitter and collector, source and drain or drain and source electrodes as the first and second main electrodes of a pnp or a field effect transistor.

What is claimed is:

1. An image reject mixer circuit arrangement, comprising:
   a) an input amplifier having a single-ended input and a single-ended output;
   b) first and second mixer cores each having respective first and second inputs; and
   c) first and second current mode phase-splitters, each of the phase-splitters having a respective input and two substantially complementary outputs, the inputs of both of the phase-splitters being connected to the output of the input amplifier, the outputs of the phase-splitters being arranged to carry signals at substantially the same frequency as the signals at the output of the input amplifier, the inputs of the first mixer core being connected to two of the outputs of the phase-splitters, the first mixer core being arranged to mix signals provided at these phase-splitter outputs with an oscillatory signal, the inputs of the second mixer core being connected to the other two of the phase-splitter outputs, the second mixer core being arranged to mix signals provided at these other phase-splitter outputs with a phase-shifted version of the oscillatory signal.

2. The image reject mixer circuit arrangement in accordance with claim 1, in which the outputs of the first phase-splitter and the outputs of the second phase-splitter are cross-coupled with the inputs of the first and second mixer cores.

3. The image reject mixer circuit arrangement in accordance with claim 1, in which the first phase-splitter comprises first and second transistors having control electrodes connected together and to a first current source, and in which the second phase-splitter comprises third and fourth transistors having control electrodes connected together and to a second current source.

4. The image reject mixer circuit arrangement in accordance with claim 3, in which the input amplifier comprises an input transistor having a control electrode arranged to receive an input signal and a first main electrode connected to the output of the input amplifier.

5. The image reject mixer circuit arrangement in accordance with claim 4, in which the control electrode of the input transistor is connected via a first resistor to a fist bias potential, and receives an input signal through a dc blocking capacitor.

6. The image reject mixer circuit arrangement in accordance with claim 4, in which an inductor is connected between a second main electrode of the input transistor and ground potential.

7. The image reject mixer circuit arrangement in accordance with claim 4, in which the first main electrode of the input transistor is connected to a second main electrode of the first transistor and to a second main electrode of the third transistor.

8. The image reject mixer circuit arrangement in accordance with claim 4, in which second main electrodes of both the second and the fourth transistors are each connected to a respective current source.

9. The image reject mixer circuit arrangement in accordance with claim 4, in which the second and the fourth transistors have second main electrodes connected to a common current source.

10. The image reject mixer circuit arrangement in accordance with claim 9, in which the second main electrodes of the second and the fourth transistors are connected to a first main electrode of a fifth transistor, the fifth transistor having a control electrode connected to a second bias potential via a second resistor, and a second main electrode connected to ground potential.

11. The image reject mixer circuit arrangement in accordance with claim 4, in which the outputs of the first and second phase-splitters are each connected to ground potential by a respective filtering capacitor.

12. The image reject mixer circuit arrangement in accordance with claim 10, in which an ac grounding capacitor is connected between the first main electrode of the fifth transistor and ground potential.

13. The image reject mixer circuit arrangement in accordance with claim 7, in which the first main electrode of the input transistor is connected to the inputs of the first and second phase-splitters by a feedback resistor, and the control electrode and the first main electrode of the input transistor are connected together by a feedback capacitor.

\* \* \* \* \*